Sept. 4, 1956 H. M. ADAMS 2,761,541

ARTICLE TRANSFER MECHANISM

Filed March 26, 1953 4 Sheets-Sheet 1

INVENTOR
HARRY M. ADAMS
BY
[signatures]
ATTORNEYS

Sept. 4, 1956 H. M. ADAMS 2,761,541

ARTICLE TRANSFER MECHANISM

Filed March 26, 1953 4 Sheets-Sheet 2

INVENTOR
HARRY M. ADAMS

BY

ATTORNEYS

Sept. 4, 1956 H. M. ADAMS 2,761,541

ARTICLE TRANSFER MECHANISM

Filed March 26, 1953 4 Sheets-Sheet 3

INVENTOR
HARRY M. ADAMS

BY

ATTORNEYS

ARTICLE TRANSFER MECHANISM

Filed March 26, 1953 4 Sheets-Sheet 4

INVENTOR
HARRY M. ADAMS

BY [signature] ATTORNEYS

United States Patent Office 2,761,541

Patented Sept. 4, 1956

2,761,541

ARTICLE TRANSFER MECHANISM

Harry M. Adams, Berkley, Mich., assignor, by mesne assignments, to the United States of America as represented by the Secretary of the Navy Application March 26, 1953, Serial No. 344,693

10 Claims. (Cl. 198—25)

This invention relates to article transfer mechanism and is concerned especially with an apparatus to convey and turn over small, frangible articles. Copending application Serial No. 324,160 of Robert L. Henry, Jr., filed December 4, 1952, sets forth a method of mass producing electronic equipment and the article handling means described hereinafter may be used as a portion of the machine schematically disclosed in the copending application, that applies metalized coatings to the wafer notches and subsequently drives the solvent from the liquid coatings.

As disclosed in the above identified application Serial No. 324,160 and copending application Serial No. 318,148, also of Robert L. Henry, Jr., filed October 31, 1952, steatite wafers arranged in modular units containing an electrical circuit, constitute the basis of and make possible a highly accelerated production of electronic equipment regardless of the complexity thereof. For reasons explained in the copending applications, the wafers of the modular units are of ceramic material and are, therefore, frangible. They must be machine handled reasonably gently to prevent breakage. Accordingly, an object of the invention is to provide an apparatus for transferring ceramic wafers from one location to another in a positive, but gentle manner in order to avoid breakage of the wafers and yet, move the wafers speedily.

Another object of the invention is to provide an apparatus for retaining wafers for an instant at a rest position and then picking them up by moving an arm thereunder, rotating them while having a superposed arm extended to a position over a given wafer whereby, when the given wafer is revolved about ninety degrees, the superposed arm is fully extended and receives the wafer so that for the rest of the wafer travel the latter arm supports the wafer, and then the apparatus places the wafer on a specially shaped conveyor bucket.

A further object of the invention is to provide an improved mechanism for stopping and retaining a wafer at rest momentarily, constantly actuating a rotor adjacent to the wafer so that at the proper timed instant, an arm carried by the rotor is extended from the rotor and passes through a passage beneath the wafer, picking up the wafer and taking it in a rotary path with the rotor until the wafer is turned over, prior to which another arm extends from the rotor on the opposite side of the wafer in order to support it for the remainder of its travel, at the end of which the wafer is disposed on a moving conveyor for subsequent operations therewith.

Other objects and features will become apparent in following the description of the illustrated form of the invention.

Figure 8:
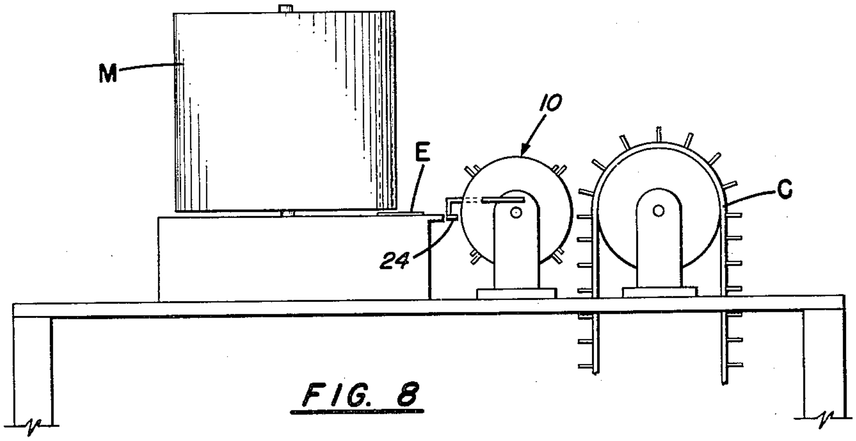
Fig. 8 is a schematic view of a portion of the machine on which the apparatus is used, showing particularly a means of placing a wafer on the platform for subsequent handling by the apparatus, and a conveyor on which the wafers are disposed.
Figure 4:
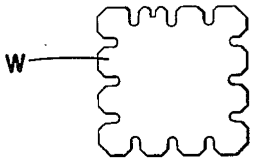
Fig. 4 is plan view of a ceramic wafer which is the suggested article to be handled by the apparatus.

The article transfer mechanism disclosed herein is generally useful to move an article from one location to another, however, in the system disclosed in the referenced application, the apparatus is operated in timed sequence with other devices. The arrangement is schematically illustrated in Fig. 8 where there is a magazine M containing a large number of any type of flat articles, one example being wafers W, in stacks. An extractor E withdraws wafers, one at a time, from the magazine, and places them on a later described platform for acceptance by apparatus 10. After being handled by the apparatus, the wafers are placed on the buckets of an endless conveyor C that is actuated in juxtaposition to the apparatus 10. Proper timing of the extractor E, apparatus 10 and conveyor C is obtained through the use of a positive drive arrangement for these assemblies, such as proper gearing, shafting, sprocket and chains and non-slip belts.

A suitable support, as standard 12 is used to retain the device 10 in proper position with respect to the ejector E and conveyor C. The support is bolted as at 14 to the machine frame, the bolts passing through slots 16 in the standard base flange to permit small adjusting movement of the support in a horizontal plane. The transfer mechanism includes end plates 18 and 20 that are held assembled by through bolt and spacer assemblies 22, and one of the end plates is fastened to the standard by bolts 23 in slots 25, constructed similar to the bolt arrangement at 14 to allow for adjustment of the apparatus 10 in a vertical plane.

A platform 24 is provided at the inlet part of the apparatus 10 to accept single articles and hold them poised in proper position for acceptance by the rotor 26 of the article transfer mechanism. Platform 24 consists of bracket 28 and bracket 30 bolted as at 31, or otherwise secured to end plates 18 and 20 the brackets terminating in horizontally aligned ends 27 and 29 that are spaced from each other and to which wafer shelves 32 and 34 are adjustably secured, by screws 36 that are provided in clearance slots. The confronting edges of the shelves have grooves 38 and 40 respectively formed therein to seat two edges of wafer W as it is moved and dropped therein by the extractor E and at a position slightly lower than the extractor E. A stop 42 is provided at the end of one groove to limit the travel of each wafer, and the shelf on which stop 42 is located is located in closer to the rotor 26 than the groove of the opposite shelf.

Figure 1:
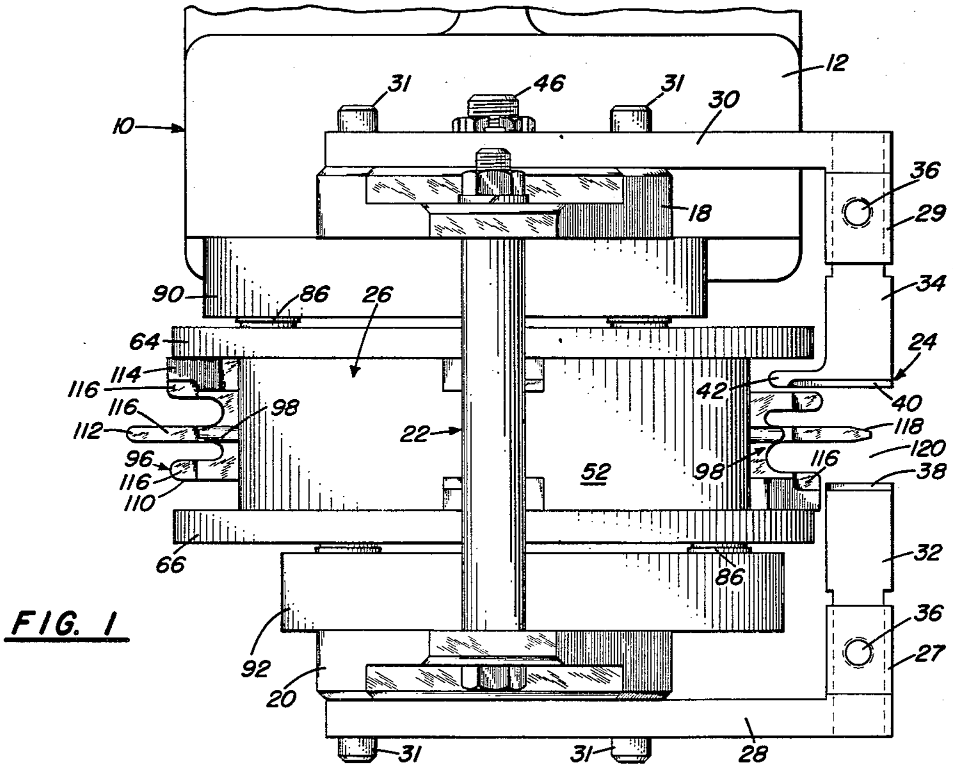
Fig. 1 is a plan view of the article transfer mechanism.
Figures 3, 7:
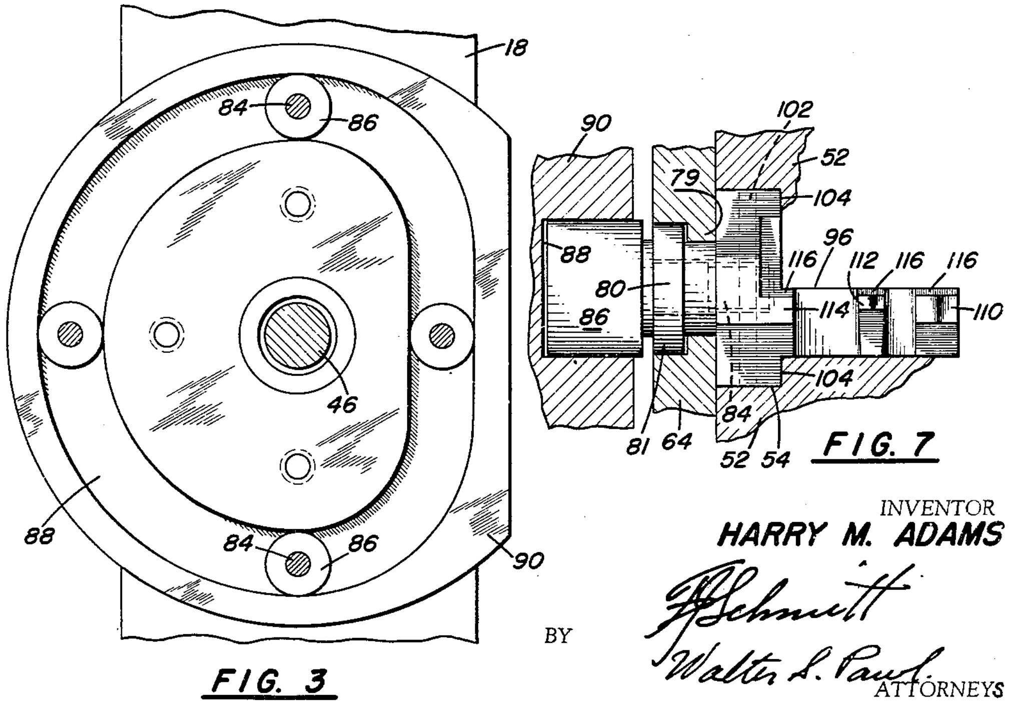
Fig. 3 is a sectional view taken on the line 3—3 of Fig. 2 and in the direction of the arrows.
Fig. 7 is an end view of one of the article pick up arms.

The rotor actuation means comprises a shaft 46 that is mounted for rotation in aligned bearings 48 carried in openings of the end plates 18 and 20, and the shaft is adapted to be driven from a source of power from the machine at proper speed with respect to extractor E and conveyor C. Shaft 46 is coupled to the rotor 26 by conventional means, such as pin 50 that is fitted in a shaft slot and a slot in a rotating guide 52. Guide 52 is at the center of the rotor, forming a part thereof, and it consists of a cylinder with a center opening receiving shaft 46, together with four radial guide slots 54, 56, 58 and 60, each of which is spaced ninety degrees apart and each of which opens through the periphery of the rotating guide. Each guide slot contains four shoulders 104 at the sides thereof at a level below the faces of the rotating guide, the function of which being described subsequently. End plates 64 and 66 are secured, as by screws 68, to the faces of rotating guide 52, and since plates 64 and 66 are identical, only plate 64 (Fig. 6) is shown in detail. It is a circular disc with a central aperture containing shaft 46, and a retainer 70 in a groove in the shaft to center the rotor on the shaft. Slots 72, 74, 76 and 78 paralleling slots 54, 56, 58, and 60, are provided in plate 64, and all of these slots are provided with shoulders 79, one on each longitudinal side of each slot to accommodate a spacer 80 that is circular in form but has a flange 81 to seat on the two shoulders 79 of slot 72 (Fig. 7).

Spacer 80 is one of four that operate in slots 72, 74, 76, and 78, respectively and each spacer is mounted on a spindle 84, secured at one end to a wafer pick up and deposit arm. The opposite end of four spindles contains a cam follower 86 operable in a cam 88 which is formed as a groove in a cam body 90, bolted or otherwise secured to the inner surface of end plate 18. Another cam member 92 is secured to end plate 20 and has cam followers 94 in the cam groove thereof, which extend from the remaining four pick up and deposit arms of rotor 26.

Figure 2:
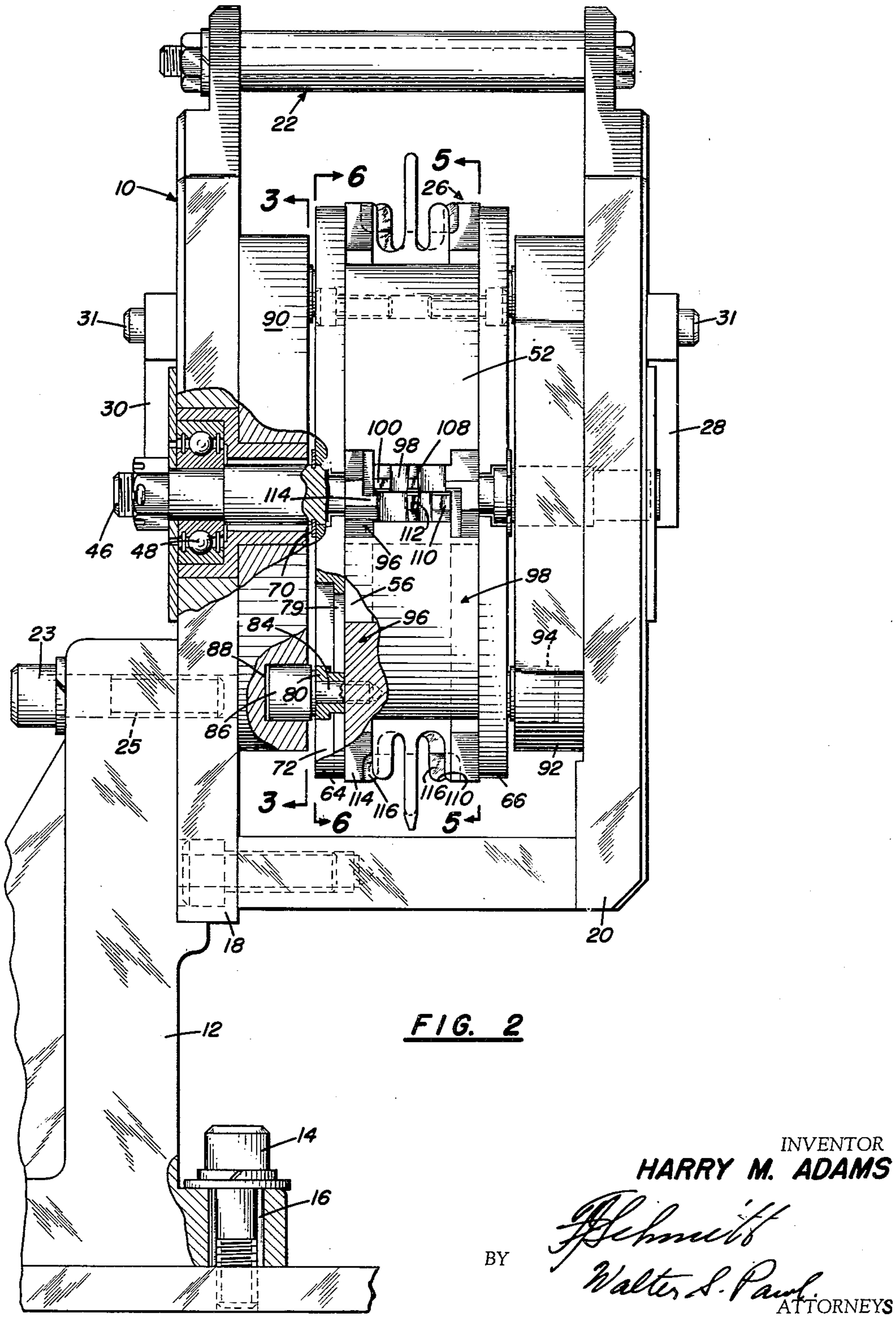
Fig. 2 is an end view of the mechanism, portions being broken away to show internal detail.
Figures 5, 6:
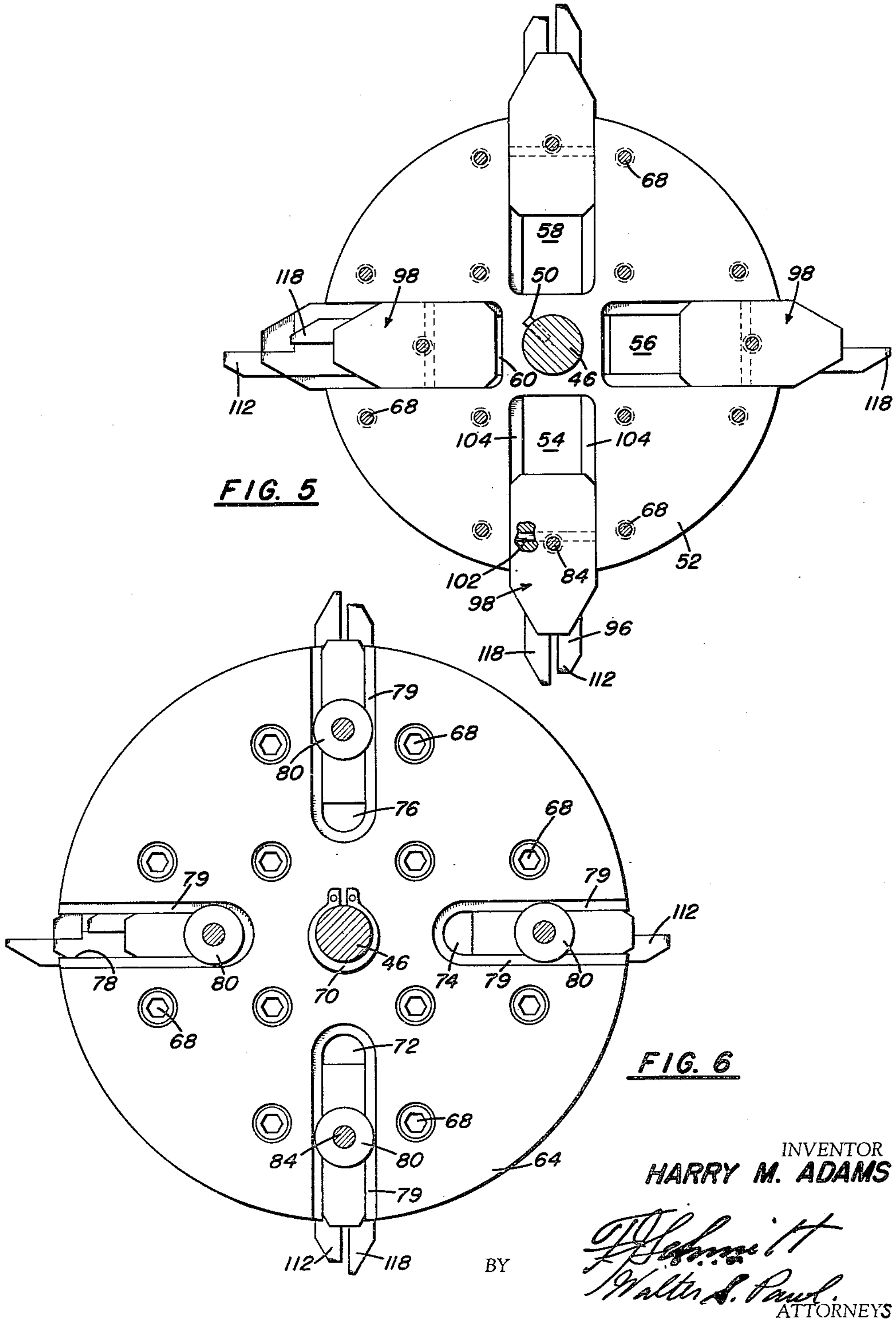
Fig. 5 is a sectional view taken on the line 5—5 of Fig. 2 and in the direction of the arrows.
Fig. 6 is a sectional view taken on the line 6—6 of Fig. 2 and in the direction of the arrows.

The rotor 26 contains four pairs of pick up and deposit arms, each pair being radially arranged with respect to the rotor and spaced ninety degrees apart. Since all pairs of arms are identical a description of only one pair follows, and the pair consists of a first arm 96 together with a superposed second arm 98, between which there is a wafer pocket 100 (Fig. 2) when the arms 96 and 98 are in such positions as to contain a single wafer which has been picked up from the platform 24. Arm 96 is generally T shaped including a vertical plate to which is joined a horizontal plate the former having a tapped opening in which spindle 84 is threaded and pinned, by dowel 102, to hold it fixed to the spindle. Shoulders 104, previously mentioned are provided at the sides of guide slots 54, 56, 58 and 60, and the vertical plate portion of arm 96 (Figs. 5 and 7) slides on the shoulders 104 of slot 54. By virtue of this construction the radial movement of arm 96 with respect to the rotor 26 is governed by the shape of cam 88, since spindle 84 has a cam follower 86 on it that is located in the cam 88. The same structural arrangement is provided for arm 98, but its cam follower is in a cam in cam member 92, the shape of which differs from the shape of cam 88. Accordingly, in operation of the rotor there will be movement of arm 96 with respect to arm 98, Fig. 5 showing the relative positions of arms 96 and 98 in four different locations.

The horizontal portion of arm 96 has three projections or fingers at the outer end thereof presenting a surface that unseats a wafer from platform 24 and supports the wafer through about ninety degrees of rotor travel when the rotor 26 is actuated. The fingers are seen at 110, 112 and 114 (Fig. 7), the side fingers 110 and 114 being shorter than center finger 112, and each finger having an upwardly opening recess 116 in it to form the lower part of wafer pocket 100. The arm 98 is similar to arm 96 except in function, and its center finger 118 is slightly longer than finger 112, providing a larger seat for the wafer while picking it up.

*Operation*

As a single wafer W is extracted by the extractor E from magazine M, the conveyor C is operated, and the rotor 26 is set in motion by torque application to shaft 46, causing guide 52 together with plates 64 and 66 to rotate as a unit. The four groups of arms, each group consisting of one wafer pick up arm 98 and one wafer deposit arm 96, are captive in the guide 52 and plates 64 and 66, however, they may move radially of the rotor due to the described slot arrangement.

The extractor E moves a wafer W onto platform 24 until it strikes stop 42 and then it is picked up by the three fingers of the arm 98. This is accomplished by having, at the moment of wafer acceptance by the fingers of arm 98, the arm 98 fully extended from rotor 26 and arm 96 fully retracted. The shape of the cam in member 92 requires the arm 98 to be extended at the time it is ready to lift a wafer from the platform 24, the fingers of arm 98 passing through the passage 120 formed by the space between grooves 38 and 40. The shape of the cam under discussion herein retains the arm 98 extended until the arm moves, with the rotor, slightly more than ninety degrees at which time the cam is responsible for retracting arm 98. During the operation, cam 88 governs the radial travel of arm 96, holding it retracted completely while the wafer is being removed from the platform 24. However, just after the wafer becomes disposed on the fingers of arm 98, cam 88 requires arm 96 to be extended in superposition to arm 98 so that the wafer is between the fingers of arms 98 and 96 and in the pocket 100 formed thereby. Arm 96 remains extended and its fingers become a seat for the wafer as it passes slightly beyond the ninety degrees of rotation point of the rotor, whence arm 98 begins to retract, full retraction thereof being effected prior to the movement of rotor 26 one hundred and eighty degrees from the wafer pick up point.

At approximately 180° travel of the rotor 26 from the picking up of a wafer, the fingers of arm 96 deposit the wafer on a slotted bucket of conveyor C by having the fingers of arm 96 pass through the slots, leaving the wafer deposited on its bucket to be carried away for further operations. Thereafter, the arm 96 retracts into the rotor 26 and the arm 98 extends outwardly of rotor 26 preparatory to accepting another wafer from platform 24.

It is understood that various changes in the specifically disclosed form of the invention may be made without departing from the scope of the following claims.

What is claimed is:

1. An article transfer mechanism comprising a support provided with a platform to receive the article, a rotor, a drive shaft mounting said rotor in said support, spaced pairs of radially arranged movable arms extending through the periphery of said rotor, means carried by said support and operatively connected with said arms for moving the arms of each pair with respect to each other inwardly and outwardly of said shaft to accept articles from said platform and contain them while the rotor is in motion and then discharge the articles.

2. An article transfer mechanism comprising a support provided with a platform to receive the article, a rotor, a drive shaft mounting said rotor in said support, spaced pairs of radially arranged movable arms extending through the periphery of said rotor, means carried by said support and operatively connected with said arms for moving the arms of each pair with respect to each other inwardly and outwardly of said shaft to accept articles from said platform and contain them while the rotor is in motion and then discharge the articles, the arms of each pair being spaced from each other an amount slightly greater than the thickness of the article to be located therebetween, thereby forming an article pocket.

3. In an article transfer mechanism, a support, a rotor carried by said support, a platform for supporting articles at the inlet side of the rotor and having a passage therein, means projecting from said rotor and operable through said passage for obtaining an article from said platform for rotating the articles approximately 180° and for then discharging the articles, including pairs of elongated parallel superposed arms spaced apart to form article pockets, and means for moving one arm of each pair along its longitudinal axis and parallel with respect to the other arm of its pair, said arm moving means including a stationarily disposed cam, guide means in said rotor, and cam followers connected to said arms, located in said guide means and operatively connected with said cam.

4. In a mechanism for transferring flat, frangible articles that are fed individually from a feed device, a platform having a passage therethrough and having an article seat slightly displaced vertically from the point of discharge from the feed device so that an article may assume a rest position on the platform, a support having a rotor therein, said rotor being provided with spaced peripheral openings and lateral openings, pairs of article handling arms operable in said peripheral openings, each pair consisting of a first arm that moves beneath the article on the platform and through the passage when the rotor is actuated, a second arm laterally spaced from the first arm that seats the article when it has moved more than ninety degrees rotationally with the rotor, means passed through one of said lateral openings for extending the first arm prior to its moving through the passage, and means passed through another of said lateral openings for withdrawing the second arm inwardly of the rotor when said first arm is moving through said passage and for extending said second arm after it has passed through said passage.

5. In a mechanism for transferring flat, frangible articles that are fed individually from a feed device, a platform having a passage therethrough and having an article seat slightly displaced vertically from the point of discharge from the feed device so that an article may assume a rest position on the platform, a support having a rotor therein, said rotor being provided with spaced peripheral openings and lateral openings, pairs of article handling arms operable in said peripheral openings, each pair consisting of a first arm that moves beneath the article on the platform and through the passage when the rotor is actuated, a second arm laterally spaced from the first arm that seats the article when it has moved more than ninety degrees rotationally with the rotor, means passed through one of said lateral openings for extending the first arm prior to its moving through the passage, and means passed through another of said lateral openings for withdrawing the second arm inwardly of the rotor when said first arm is moving through said passage and for extending said second arm after it has passed through said passage, including cam followers secured to said arms and extending through said lateral openings, a cam secured to said support on each side of said rotor, some of said cam followers being located in one of the cams and the other cam followers being disposed in the other cam so that the arms are moved relative to the rotor when said rotor is actuated.

6. The mechanism of claim 5 and, said seat including a pair of brackets, shelves secured to said brackets and having confronting edges defining walls of said passage, and said edges having upwardly and laterally opening grooves therein to accommodate the article edges.

7. The mechanism of claim 6 and; one of said shelves having an article stop at the inner end of the groove therein.

8. For use in an article transfer mechanism that includes a support, a rotor mounted for rotation in the support, cams secured to the support adjacent to said rotor, a pair of parallel adjacent arms superposed and extending from the periphery of said rotor, and means connected to said arms and in contact with said cams for moving said arms inwardly and outwardly of the rotor and parallel with respect to each other, including cam followers connected to said arms, and said arms having an article accommodating pocket therebetween.

9. For use in an article transfer mechanism that includes a support, a rotor mounted for rotation in the support, cams secured to the support adjacent to said rotor, a pair of parallel adjacent arms superposed and extending from the periphery of said rotor, and means connected to said arms and in contact with said cams for moving said arms inwardly and outwardly of the rotor and parallel with respect to each other, each arm having a plurality of fingers extending from the outer end thereof, said fingers having surface recesses therein, the recesses in the fingers of one arm confronting the recesses in the fingers of the other arm to thereby form an article pocket.

10. In an article transfer mechanism, a support, a rotor carried by said support, a platform for supporting articles at the inlet side of the rotor and having a passage therein, means projecting from spaced points on the periphery of said rotor and in fixed angular relationship to the rotor, said means being operable through said passage for obtaining an article from said platform, for rotating the articles approximately 180° and for then discharging the articles, each of said means including a pair of adjacent, parallel arms spaced apart to form an article pocket, and means for moving the arms of each pair along the longitudinal axis thereof.

References Cited in the file of this patent

UNITED STATES PATENTS

| | | |
|---|---|---|
| 937,994 | Harding | Oct. 26, 1909 |
| 1,230,771 | Pflanze | June 19, 1917 |
| 1,326,905 | Birch | Jan. 6, 1920 |
| 1,539,258 | Graupner | May 26, 1925 |
| 1,958,846 | Christensen | May 15, 1934 |
| 2,337,528 | Stuckert et al. | Dec. 21, 1943 |
| 2,366,615 | Hansen | Jan. 2, 1945 |
| 2,443,281 | Terry | June 15, 1948 |
| 2,670,090 | Crawley | Feb. 23, 1954 |